United States Patent
Slonaker et al.

(10) Patent No.: US 10,871,708 B2
(45) Date of Patent: Dec. 22, 2020

(54) SPATIAL-FREQUENCY MATCHED WAFER ALIGNMENT MARKS, WAFER ALIGNMENT AND OVERLAY MEASUREMENT AND PROCESSING USING MULTIPLE DIFFERENT MARK DESIGNS ON A SINGLE LAYER

(71) Applicant: Nikon Corporation, Tokyo (JP)

(72) Inventors: Steven Douglas Slonaker, San Mateo, CA (US); Stephen P. Renwick, Moss Beach, CA (US)

(73) Assignee: Nikon Corporation, Tokyo (JP)

( * ) Notice: Subject to any disclaimer, the term of this patent is extended or adjusted under 35 U.S.C. 154(b) by 151 days.

(21) Appl. No.: 15/879,286

(22) Filed: Jan. 24, 2018

(65) Prior Publication Data
US 2018/0210332 A1 Jul. 26, 2018

Related U.S. Application Data

(60) Provisional application No. 62/449,808, filed on Jan. 24, 2017.

(51) Int. Cl.

| | | |
|---|---|---|
| *G03F 1/42* | (2012.01) | |
| *G03F 1/22* | (2012.01) | |
| *G03F 7/20* | (2006.01) | |
| *G03F 9/00* | (2006.01) | |
| *H01L 23/544* | (2006.01) | |
| *H01L 21/027* | (2006.01) | |
| *H01L 21/66* | (2006.01) | |

(52) U.S. Cl.
CPC .................. *G03F 1/42* (2013.01); *G03F 1/22* (2013.01); *G03F 7/2004* (2013.01); *G03F 9/7076* (2013.01); *H01L 21/0274* (2013.01); *H01L 22/20* (2013.01); *H01L 22/30* (2013.01); *H01L 23/544* (2013.01); *H01L 2223/54426* (2013.01)

(58) Field of Classification Search
CPC ........... G03F 1/42; G03F 1/22; G03F 7/2004; G03F 9/7076
USPC ....................................... 430/5, 22
See application file for complete search history.

(56) References Cited

U.S. PATENT DOCUMENTS

| | | |
|---|---|---|
| 6,342,735 B1 | 1/2002 | Colelli et al. |
| 6,610,448 B2 | 8/2003 | Sato et al. |

FOREIGN PATENT DOCUMENTS

| | | |
|---|---|---|
| EP | 0807854 | 11/1997 |

OTHER PUBLICATIONS

Benschop et al., "Integrated scatterometry for tight overlay and CD control to enable 20-nm node wafer manufacturing," *Proc. of SPIE*, 8683:86830P-1-86830P-8 (2013).
Mulkens et al., "Holistic optimization architecture enabling sub-14-nm projection lithography," *J. Micro/Nanolith. MEMS MOEMS*, 13:011006-1-011006-10 (Jan.-Mar. 2014).

*Primary Examiner* — Christopher G Young
(74) *Attorney, Agent, or Firm* — Klarquist Sparkman, LLP

(57) ABSTRACT

Alignment patterns that are selected based on device pattern spatial frequencies are defined on a reticle. The alignment patterns can include periodic arrays of lines, spaces, dots, of other pattern elements. Such patterns can be defined as sets associated with a common spatial frequency or frequency range, or some or all sets can include alignment marks having mark elements associated with different spatial frequencies.

40 Claims, 15 Drawing Sheets

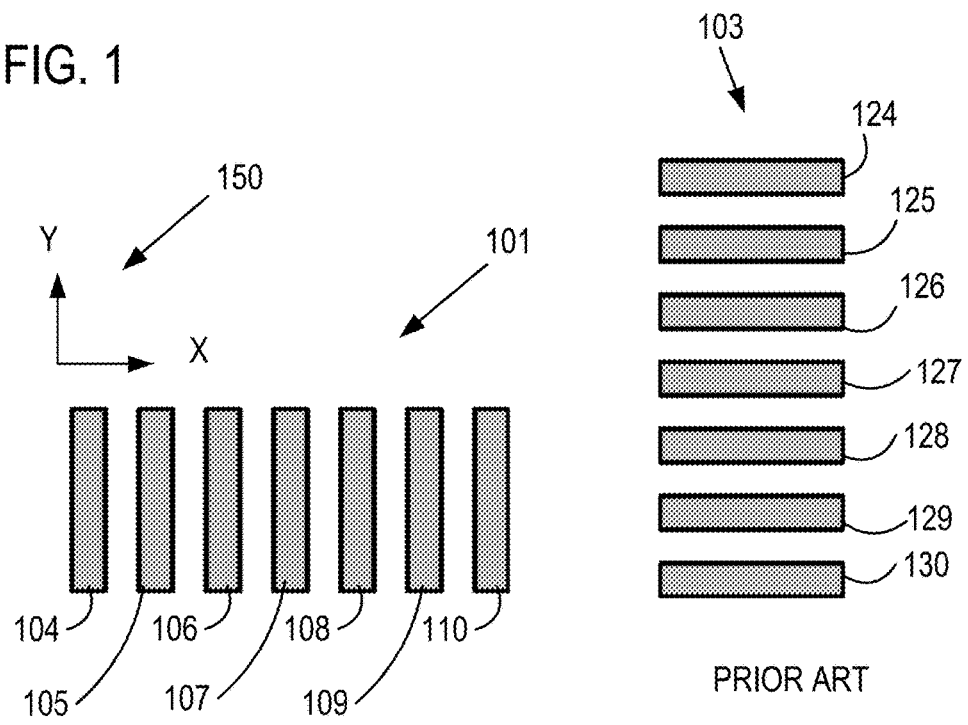
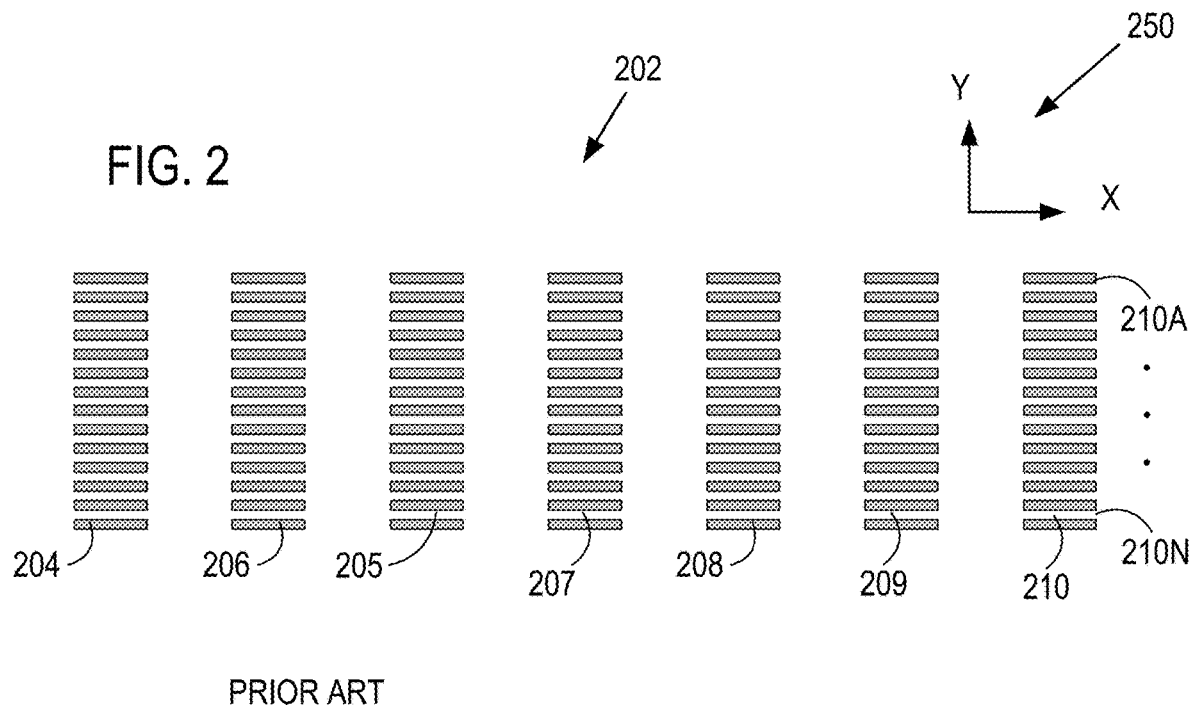

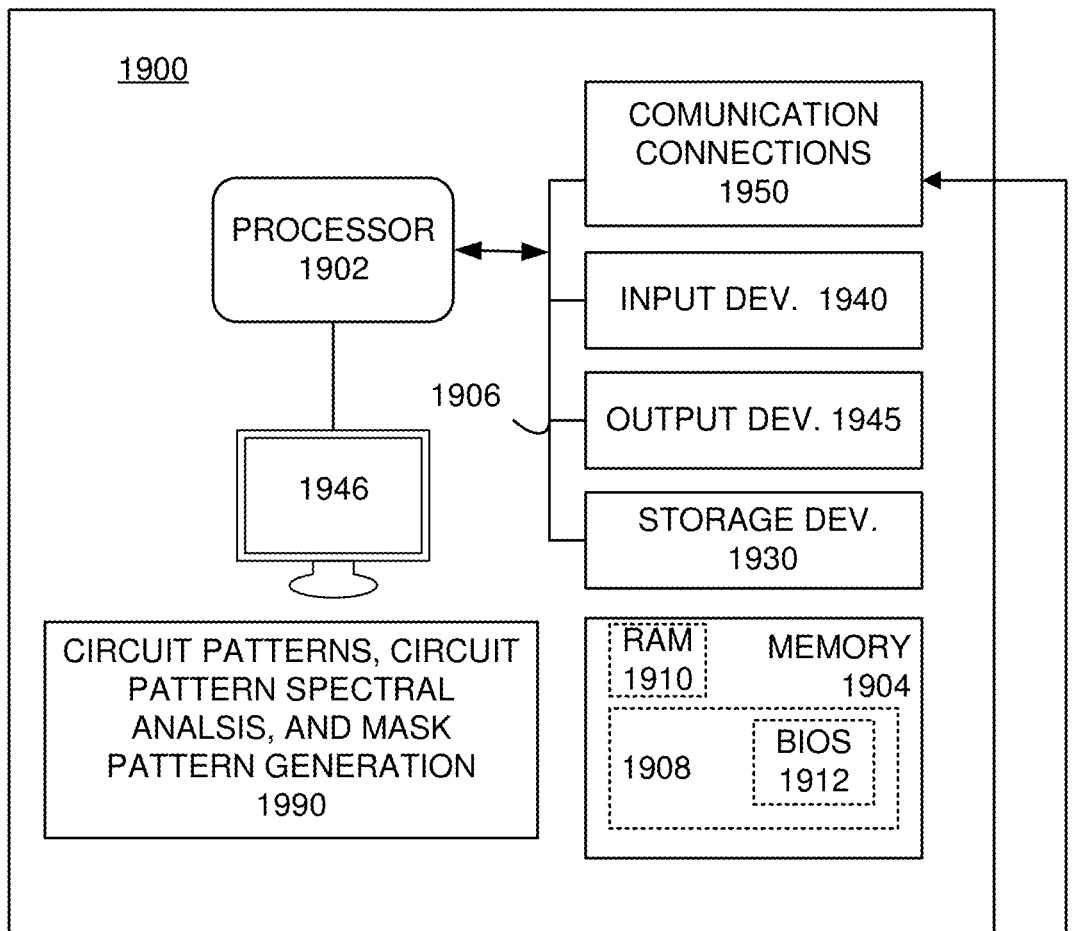
FIG. 19
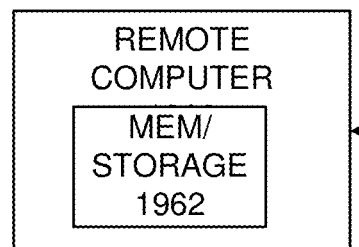

SPATIAL-FREQUENCY MATCHED WAFER ALIGNMENT MARKS, WAFER ALIGNMENT AND OVERLAY MEASUREMENT AND PROCESSING USING MULTIPLE DIFFERENT MARK DESIGNS ON A SINGLE LAYER

CROSS REFERENCE TO RELATED APPLICATION

This application claims the benefit of U.S. Provisional Application No. 62/449,808, filed Jan. 24, 2017, which is hereby incorporated by reference in its entirety.

FIELD

The disclosure pertains to mask and wafer alignment.

BACKGROUND

In the high resolution lithographic processes used in semiconductor manufacturing, patterns that define circuits are transferred to a sensitized substrate (such as a photoresist-coated silicon wafer), typically by projecting patterns using radiation in the ultraviolet (UV), extreme ultraviolet (EUV), or other visible or non-visible wavelengths. The patterns to be transferred are defined on a reticle (or "mask") that generally also includes one or more alignment marks. The alignment marks are measured and calibrated according to the metrology system applied at the image plane, so that patterns to be transferred can be precisely placed relative to the existing patterns on the sensitized substrate. Such placement is especially important as any particular circuit can require exposures of patterns from many different reticles, and any misalignment between exposure layer above known tolerance values are known to produce parts that do not perform as well as those with better and tighter alignment throughout all layers of the chip manufacturing process.

FIG. 1 illustrates one example of conventional alignment marks (also referred to as "fine alignment marks") that include a set 101 of rectangular marks 104-110 with a fixed spacing along an X-axis of a coordinate system 150 and a set 103 of alignment marks 124-130 with a fixed spacing along a Y-axis of the coordinate system 150. For convenience, the sets 101, 103 can be referred to as multi-marks, and in the example of FIG. 1, each includes seven elements. In this example, the set 101 is an example of a seven-element X-direction Multi-Mark. Positions of each mark in such mark sets are typically measured using a camera system, and an average of the positions (seven positions in this example) is reported as an offset of a center-position of the multi-mark With the advent of Chemical-Mechanical Polishing (CMP) and other highly tuned etching techniques being applied to wafer processing, the large areas of such mark elements were observed to etch less repeatably and reliably than smaller patterns in the product device. To counteract these negative processing effects, strict 'Design Rules' were adopted which required that no pattern be larger than a specified 'Maximum CD'. As a result, alignment mark designs began to be subdivided (or 'segmented'), so that each alignment mark of a multi-mark comprises a plurality of segments to enhance repeatability. FIG. 2 illustrates a set 200 of equi-spaced alignment marks 204-210 distributed along an X-direction defined by a coordinate system 250. Each single alignment mark (e.g. 204) is divided into equi-spaced segments distributed along a Y-direction.

While such segmented mark designs can satisfy etch-process-related design rules and constraints, such designs can fail to accurately reflect the actual device pattern shifts during pattern transfer. Thus, even though the patterns are accurately etched and/or polished, they can fail to permit precise pattern alignment.

SUMMARY

The disclosure pertains generally to alignment of product device patterns existing on a substrate using alignment marks or sets of alignment marks specifically selected to have spatial frequency spectra corresponding to the device patterns on the substrate to be aligned to, and associated alignment apparatus, pattern masks, and related methods. Such marks or sets of marks can be situated throughout a patterned wafer so that the defined mark patterns receive similar processing as device patterns. Using such spectrally targeted alignment patterns, various specific device pattern regions within each exposure field can be represented and included in the measurement and modeling of the wafer pattern, leading to a more accurate model of that wafer pattern. The more accurate model enabled by the inclusion of the spectrally targeted alignment mark designs leads to improved overlay accuracy in the exposure of any level on top of that alignment pattern.

Patterned device wafers comprise a substrate and a plurality of device pattern areas defined on the substrate. A set of alignment marks distributed along a first axis is defined on the substrate, wherein each alignment mark includes a periodic array of alignment mark elements distributed along the first direction. In some examples, at least one of the alignment marks includes a plurality of segments distributed along a second axis that is different from the first axis and the second axis is perpendicular to the first axis. According to some embodiments, each of the alignment marks is associated with a different spatial frequency. According to other examples, a plurality of sets of alignment marks is defined on the substrate, each alignment mark set including alignment marks distributed along the first direction, wherein each alignment mark includes a periodic array of alignment mark elements distributed along the first direction. In some cases, at least one of the alignment marks of each set includes a plurality of segments distributed along a second axis that is different from the first axis and each of the sets of alignment marks is associated with a different spatial frequency. Alignment marks elements and the distribution of such elements is generally selected based on spatial frequencies associated with one or more device patterns.

It should be noted that the various elements of multi-mark may themselves vary in design, for example according to differing spatial frequency content. The multi-mark configuration shown is typically used to provide a statistical improvement to the measurement of a single offset through application of a single average offset calculated from the average of the offsets from each of the multi-mark elements. However, if not enough area is available in the circuit layout to accommodate multi-mark designs for all of the desired different spatial frequency bands, it may be decided to forego the statistical advantage of identical multi-mark elements in favor of applying a different element design over each element in the region.

Methods comprise defining a plurality of sets of alignment marks on a substrate, the alignment marks distributed along a first direction, wherein each alignment mark includes a periodic array of alignment mark elements distributed along the first direction. At least a first circuit pattern is defined on the substrate and a second circuit pattern is aligned with respect to the first circuit pattern based on detection of at least one of the plurality of sets of alignment marks. Typically, the detection of at least one of the plurality of sets of alignment marks includes illuminating the at least one of the plurality of sets of alignment marks and obtaining an image or other detection signal (e.g. edge detection) from the at least one of the plurality of sets of alignment marks. In additional examples, a second circuit pattern is defined on the substrate after aligning the second circuit pattern's image position to the existing first pattern on the substrate.

Methods comprise obtaining a spatial frequency spectrum associated with a circuit pattern. Based on the obtained spatial frequency spectrum, alignment mark set patterns that include a plurality of alignment marks distributed along a first direction are defined, wherein each alignment mark includes a periodic array of alignment mark elements along the first direction. The alignment mark set patterns are transferred to a mask for eventual transfer to a device substrate simultaneous with the printing of the respective layer of the device being considered. In some examples, the alignment mark set patterns are established in a metallic layer on a mask substrate.

The foregoing and other objects, features, and advantages of the disclosure will become more apparent from the following detailed description, which proceeds with reference to the accompanying figures.

BRIEF DESCRIPTION OF THE DRAWINGS

FIG. 1 illustrates examples of conventional X and Y alignment marks.

FIG. 2 illustrates examples of conventional segmented alignment marks.

FIG. 19 illustrates an exemplary computing environment.

DETAILED DESCRIPTION

Figure 3B:
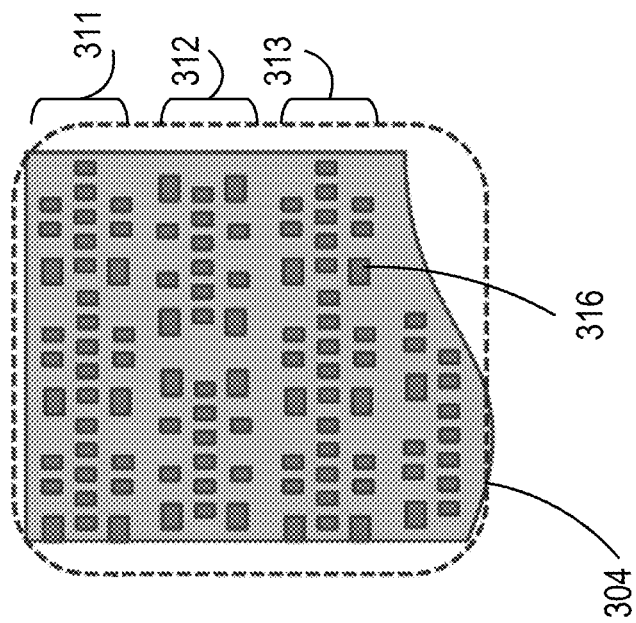
FIGS. 3A-3B illustrate alignment marks having different mark element designs selected based upon or copied from a device pattern and/or its spectrum.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items unless otherwise indicated.

The systems, apparatus, and methods described herein should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like, or with respect to particular coordinate axes. These terms are used for convenient description, but do not imply any particular spatial orientation The disclosure generally pertains to methods, systems, and components that can be used in establishing precise positioning in, for example, projection lithography. In some examples, differences in edge placement errors ("EPEs") associated with alignment marks and edge placement errors in product device manufacturing are controlled, reduced, or eliminated with single alignment marks or groups of alignment marks that contain a selected spatial frequency content corresponding to a spatial frequency content of the product device pattern or other preferred spatial frequency content. Such alignment marks can be placed within product device pattern areas, so that the marks receive the same processing as the device pattern. Alignment measuring systems can measure one or more marks or groups of marks and produce an associated alignment signal.

As used herein, terms such as power spectrum, spatial frequency content, spatial frequency distribution and the like refer generally to an amplitude as a function of spatial frequency that can be obtained with a Fourier transform of a device pattern. Amplitude as a function of spatial frequency can be obtained without such a transform such as by measurement, but application of a Fourier transform can be more convenient. Unless specifically noted as referring to a single spatial frequency, such terms refer to amplitudes in a range of spectral frequencies. While pattern elements discussed below can be based on single spatial frequencies, pattern elements can be defined over spatial frequency ranges, multiple single spatial frequencies, spectral bandwidths associated with frequency chirps. In some cases, the disclosed methods, apparatus, and products can be used in enhanced global alignment (EGA) as described in U.S. Pat. No. 4,677,301 which is incorporated herein by reference, or in any other sequence or system that uses measurements of alignment marks distributed over the wafer as inputs into a Wafer Model.

Device and alignment patterns are often defined in a metallic layer such as an aluminum or tungsten layer over a dielectric (i.e. transparent) substrate such as fused silica, but other layers and substrates are also used as alignment layers. In the examples described below, and for ease of illustration, patterns generally are defined by substantially transmissive (or reflective) and non-transmissive regions in metallic layer so that pattern modulation is on/off modulation, but patterns can be defined in which modulation is in the form of 'phase steps' in the wafer topography, without necessarily any variation in the top surface material. In these cases the reflected light from the alignment mark is continuous in initial amplitude, and in these cases it is the diffraction and scatter from the sloped portions as well as potential interference patterns that can be generated from the two 'steps' that may be detected by the alignment detection system and cameras. In typical examples, a single mask (also referred to herein as a "reticle") includes patterns for one or more devices, and many masks (and associated layer-specific patterns) are needed to fully define devices. Alignment of a series of device patterns, as during the manufacturing of complete integrated circuit device, can be accomplished as disclosed herein.

In some cases, lens-induced pattern degradation or distortions in pattern transfer can produce alignment errors that are spatial frequency dependent. Thus, alignment marks that are typically much larger than circuit pattern features undergo different distortions than the circuit pattern. Conventional marks, including segmented marks such as illustrated in FIGS. 1-2 can exhibit these distortions. By matching spatial frequency content of the alignment marks to that of the product device pattern, lens-induced distortions during exposure can be the same, similar, or correlated between alignment marks and a device pattern.

Spatial frequency content of alignment marks and device patterns can be made the same or similar by, for example, using a portion of the device pattern as a 'fill' pattern for each mark element. Selection of such a pattern portion can be difficult, and in some cases, the device pattern may not include a suitable pattern portion. Such circuit pattern dependence can also require that a pattern portion be selected for each circuit pattern, and mark element patterns may not be reused for different circuits. In another approach, a composite mark is defined with one or more basis-function marks such that a power spectral density (PSD) of the composite mark matches or otherwise corresponds to a PSD of the device pattern. For example, each mark element in a set can be selected to include mark element portions or segments associated with a selected spatial frequency or spectrum. In other approaches, groups of alignment marks within a set are defined based on associated subsets of a product device pattern's spatial frequency spectrum.

Figure 3A:
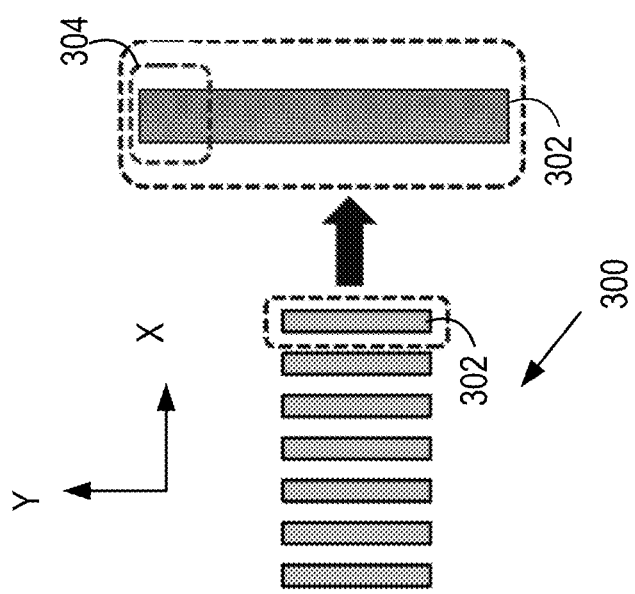

With reference to FIGS. 3A-3B, a representative X-distributed set 300 of alignment marks includes a plurality of alignment marks such as representative alignment mark 302. In some examples, the remaining alignment marks of the set 300 can be the same, similar to, or different from the alignment mark 302. A portion 304 of the alignment mark 302 is illustrated in FIG. 3B. The portion 304 includes pattern sections 311-313 that include pattern elements such as representative pattern element 316. As show, the pattern sections 311-313 are substantially the same or identical, but in other examples, each pattern row can be different or independently selected. The pattern elements are shown as rectangles having a substantially constant height (in a Y-direction) but with varying widths (in an X-direction). Pattern element spacings, widths, and numbers of rows in pattern sections can be selected based on spatial frequencies of a device pattern. In the example of FIGS. 3A-B, X-directed spatial frequencies are generally selected, but pattern element heights can also be varied to provide additional Y-directed spatial frequency content. In other examples, the pattern portion 304 can be defined based on one or more portions of the pattern to be transferred. In other examples, sets of mark elements of the same or different sizes such as gratings (and sets of gratings), dots, triangles, ellipses, ovals, polygons, diamond shapes, crosses or x-shapes or other uniformly regularized patterns such as distributed 'T'-shapes or zig-zags are defined based on a spatial frequency content similar to that of the device pattern. Alignment marks in a set of alignment marks can include the same or different mark elements of a common or different size.

Figure 4:
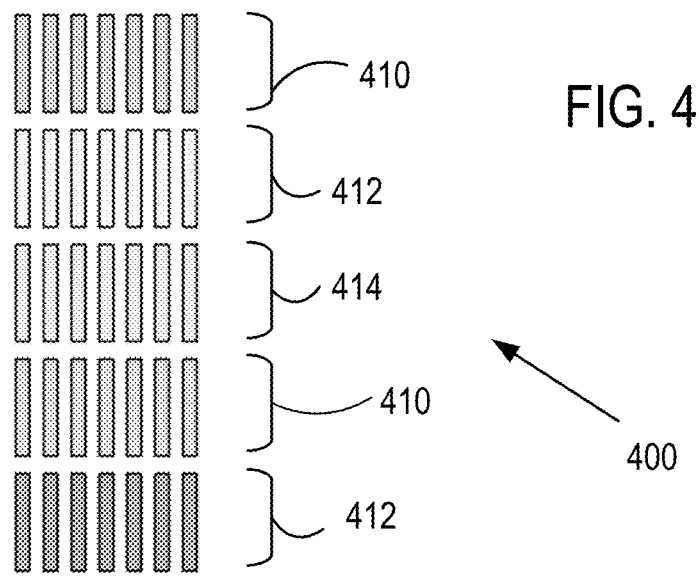
FIG. 4 illustrates sets of alignment marks associated with various respective spatial frequencies in the x direction, as captured in patterns which all share a common x-location, and y-locations which vary by very small distances (e.g. microns).
Figure 5:
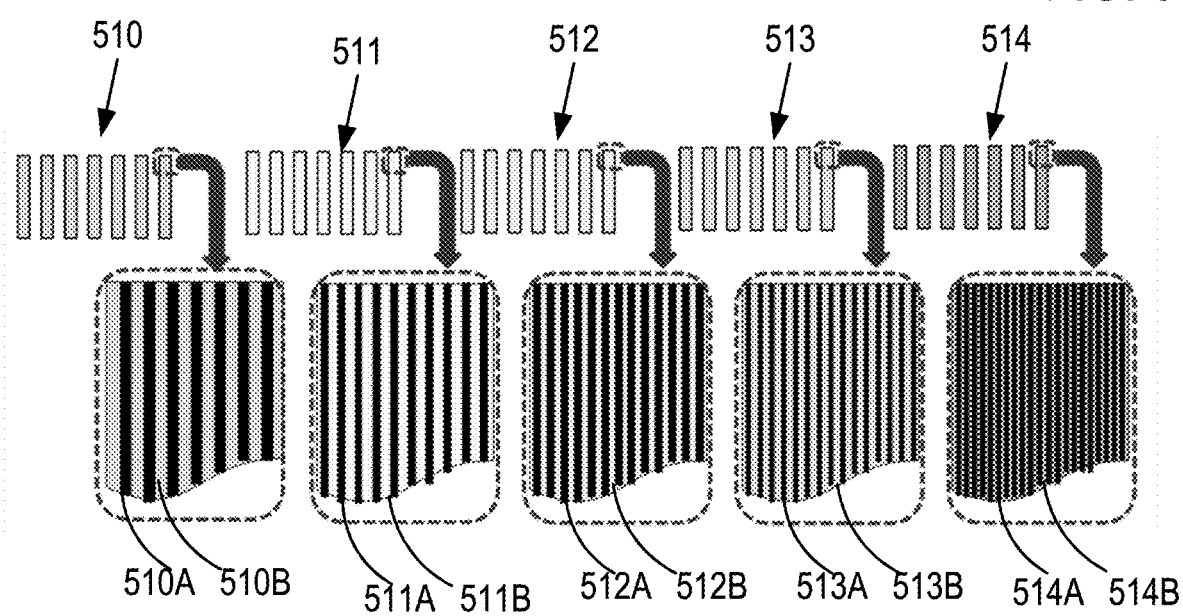
FIG. 5 illustrates a zoom-in on the 5 mark designs represented in FIG. 4, here showing an alignment mark set based on alternating lines and spaces, used to capture 5 different spatial frequency 'shift' values, respectively, in the x direction.
Figure 6:
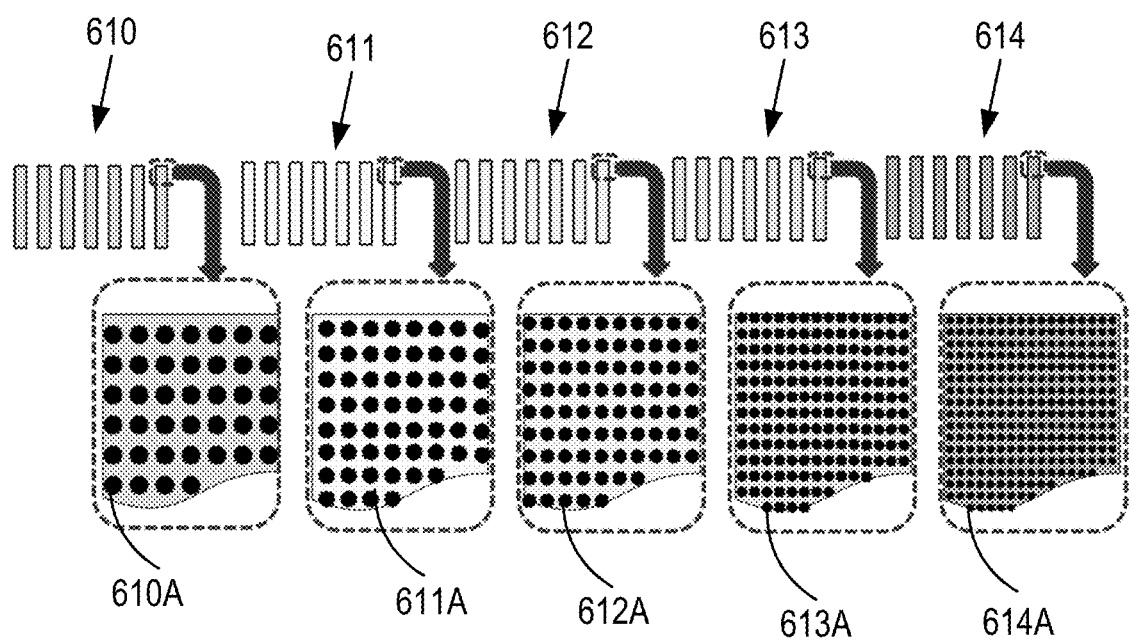
FIG. 6 illustrates an alignment mark set based on 2-dimensional periodic arrays of 'dots' (or equivalently 'holes') within each of the mark elements. The spatial frequencies in the x direction and y direction are shown in this example to be the same, but this is for illustration purposes only; differing spatial frequencies can be used in different directions. Further, each mark set may contain multiple spatial frequencies in one or both directions in their mark element designs.

FIG. 4 illustrates an alignment mark set 400 that includes sets 410-414 of alignment marks, wherein each of the alignment marks of each set is selected based on a common spatial frequency distribution. In other examples, each mark elements of each set can be based on a common spatial frequency distribution, or spatial frequency distributions can be arbitrarily assigned to one or more mark elements as may be convenient. FIGS. 5-6 illustrate representative arrangements of mark elements.

Referring to FIG. 5, a mark set 510 (corresponding to set 410 of FIG. 4, for example), includes a period array of Y-directed lines 510A and spaces 510B at a first spatial frequency (in an X-direction). A mark set 511 (corresponding to set 411 of FIG. 4, for example), includes a periodic array of Y-directed lines 511A and spaces 511B at a second spatial frequency (in an X-direction), wherein the second spatial frequency is typically different from the first spatial frequency. Similarly, mark sets 512-514 (corresponding to sets 412-414 of FIG. 4, for example), include periodic arrays of Y-directed lines 512A-514A and spaces 512B-514B at third, fourth, and fifth spatial frequencies, respectively, wherein the spectral frequencies are all different (or, in some examples, the same).

As noted above, the alignment marks in a particular set need not be associated with the same spatial frequencies, and although shown in FIG. 5 as having periodic lines and spaces, multiple spatial frequencies can be used such as frequency chirps or multiple individual spatial frequencies. Because mark elements are generally defined using transmissive and non-transmissive (or reflecting and non-reflecting) mask portions, spatial frequencies are defined based on on/off modulation at various frequencies, and total modulation at a particular spatial frequency can be controlled based on the mask pattern area associated with that spatial frequency.

In another example shown in FIG. 6, a mark set 610 (corresponding to set 410 of FIG. 4, for example), includes a periodic array of transmissive (or non-transmissive) dots 610A having a first diameter and a first spacing in an X-direction. A mark set 611 (corresponding to set 411 of FIG. 4, for example) includes a periodic array of transmissive (or non-transmissive) dots 611A having a second diameter and a second spacing in an X-direction, wherein the second diameter and the second spatial frequency are typically different from the first diameter and the first spacing. Similarly, mark sets 612-614 (corresponding to sets 412-414 of FIG. 4, for example) include periodic arrays of transmissive (or non-transmissive) dots 612A-614A having the same or different diameters and the same or different spacings in an X-directions. As shown in FIG. 6, Y-spacings are different for alignment marks in each set, so that mark sets associated with higher X-axis spatial frequencies are more closely spaced. In some examples, it is convenient to have X-axis and Y-axis spacings be the same.

In the examples of FIGS. 5-6, lines/spaces and dots/holes are shown as regions having a common transmittance or reflectance. These mark elements can also be segmented either to permit further selection of spatial frequency content or to promote uniform processing.

Figure 7:
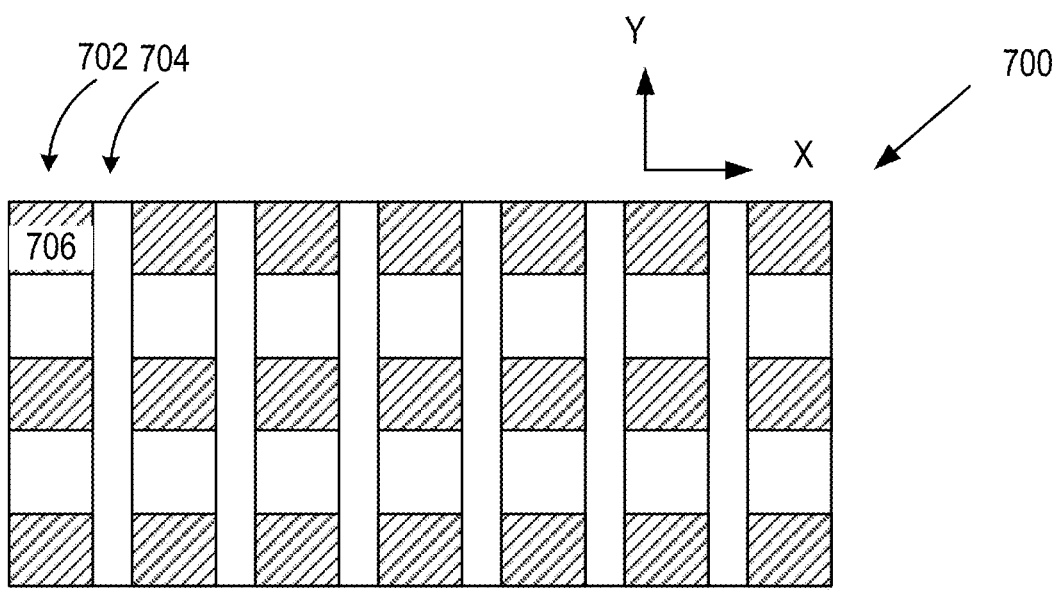
FIGS. 7-8 illustrate a segmented alignment mark sets comprised of overlapping x/y line and space grating patterns, here showing examples of applying lines and spaces of unequal widths and/or pitches along the x or y direction, or between the x and y directions.
Figure 8:
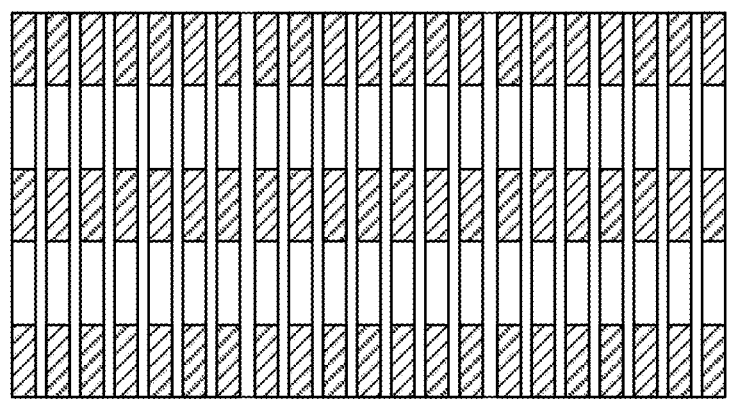
Figure 9:
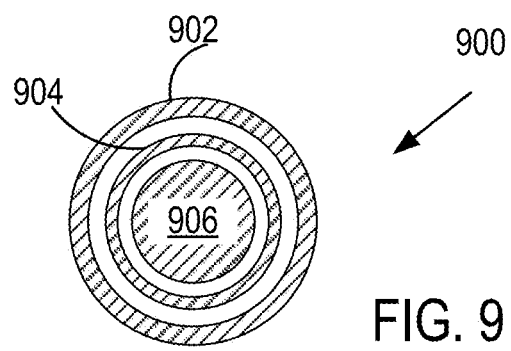
FIG. 9 illustrates one proposed circular 'fill pattern' to be repeated throughout a segmented mark element, in this example constructed of annular regions of varying width and/or pitch in the radial direction, thus including multiple spatial frequencies in its response.

FIGS. 7-9 illustrate segmentation of mark elements, if desired. FIGS. 7-8 illustrate line/space patterns 700, 800 having different spatial frequencies in an X-direction; both are segmented in a Y-direction. For example, the line/space pattern 700 includes lines such as representative line 702 and spaces such as representative space 704, with the line 702 divided into segments such as segment 706. The segments are shown as aligned in a Y-direction but can be arbitrarily spaced. In addition, in the examples of FIGS. 7-8, line and space widths (in the X-direction) are different. In general, patterns need not have similarly sized pattern portions dedicated to transmissive and non-transmissive regions. FIG. 9 illustrates a pattern dot 900 that includes segments 902, 904, 906.

Figure 10:
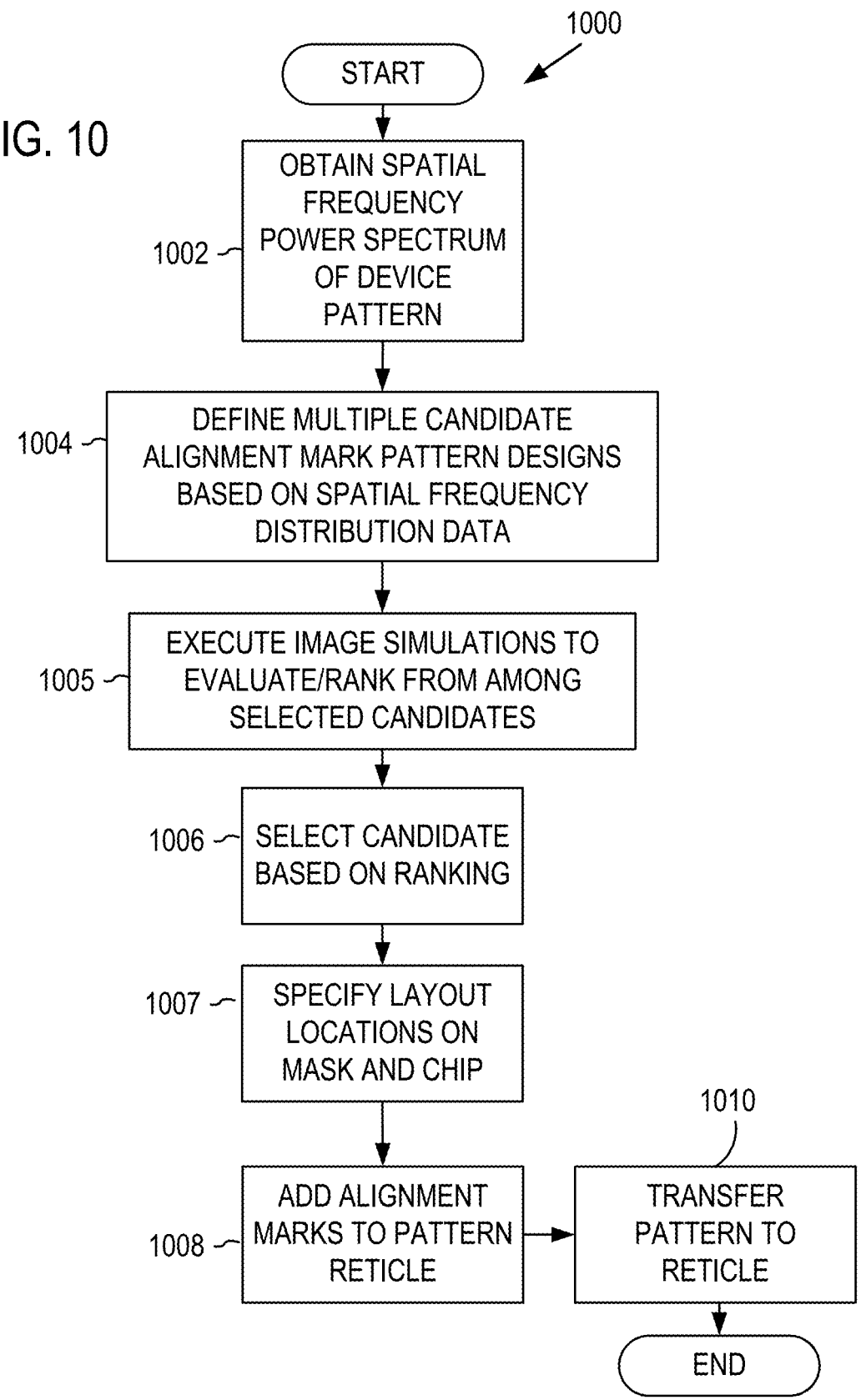
FIG. 10 illustrates a method of making a pattern mask operable to produce a device with using the disclosed alignment methods and apparatus.

Referring to FIG. 10, in a representative method 1000, spatial frequency content of a device pattern is first obtained by FFT techniques or otherwise obtained at 1002, and a power spectral density function (PSD) or other estimation of device pattern spatial frequency content is obtained. In some examples, spatial frequency content is obtained directly from a device pattern definition, without measurement. At 1004, based on the PSD or other representation of device pattern spatial frequency content, multiple candidate alignment mark pattern designs are produced. Typically, frequencies containing the most distinct maxima and those associated with the known minimum exposure pitches are identified and evaluated, and a selection is made of a target spatial frequency content range or ranges to be included in an alignment mark fill pattern. Then, sets of dots (or other uniformly regularized patterns) associated with the specified ranges or ranges are used as a basis set of spatial-frequency functions, and their weights are varied by nonlinear optimization such that the PSD of the set matches the PSD of the device pattern (or other target function based upon weighted portions of the device pattern PSD). At 1005, simulations are performed to evaluate and rank some or all candidate mark pattern designs, and a preferred pattern is selected based on the ranking at 1006 to permit defining marks and mark patterns (including pattern sub-elements and pattern fills). At 1007, locations for the selected pattern or patterns on the mask or chip are specified, and at 1008 the defined pattern is added to a reticle pattern. In some cases, it may be advantageous to place the alignment marks within the device pattern area on a reticle. Placement of more than one alignment mark (or set of alignment marks) in the reticle pattern area would enable measurement and correction of within-field distortion and overlay errors, but alignment marks can be placed within or outside of a pattern area. At 1010, the reticle pattern (circuit and alignment marks) is transferred to a reticle for use in lithographic or other processes use in transferring circuit patterns to a sensitized substrate.

Figure 11:
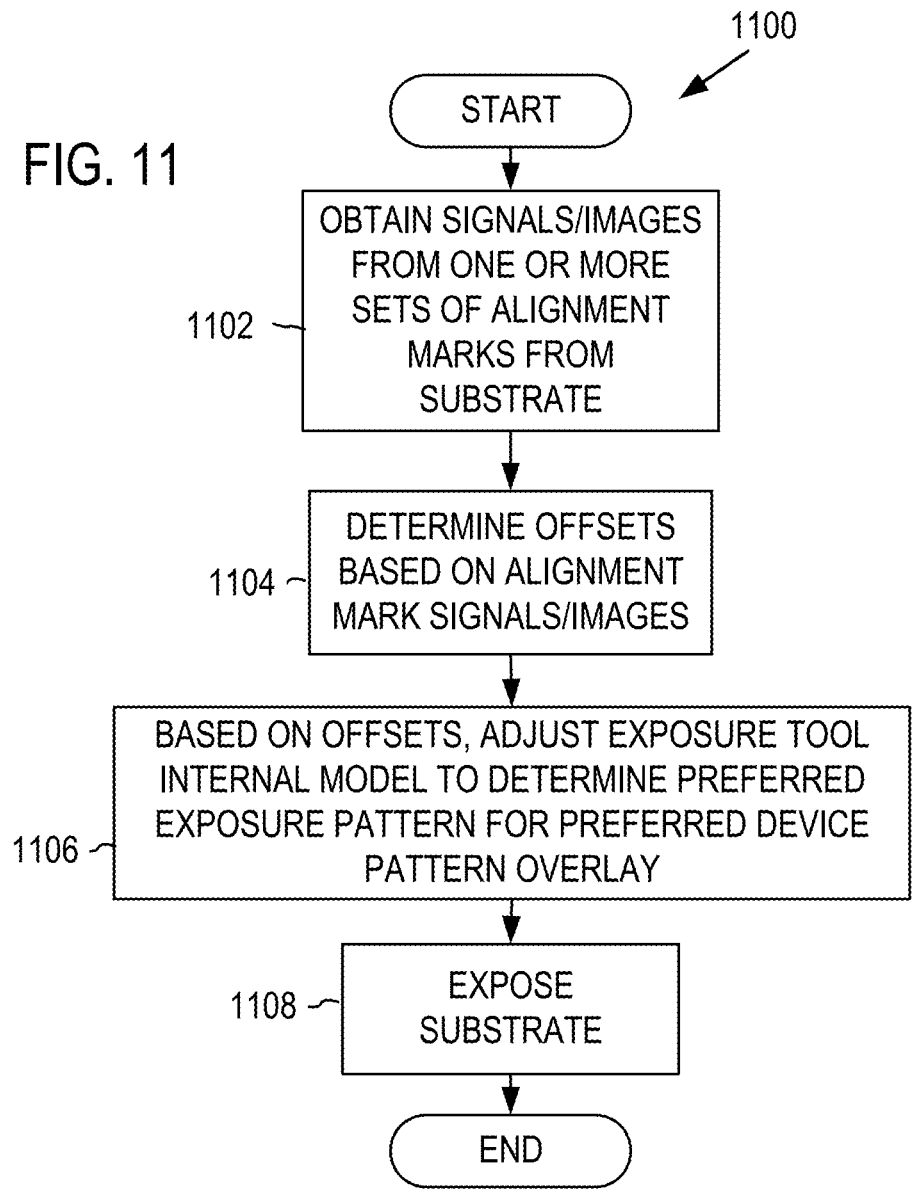
FIG. 11 illustrates a generalized alignment method.

With reference to FIG. 11, a representative alignment method 1100 includes exposing at least one mark pattern, or one or more clusters of mark patterns with optical radiation to obtain an image or signal associated with one or more sets of alignment marks at 1102. Typically, the mark patterns are defined on a sensitized substrate and imaged onto an image capture device, and the captured images are processed to determine edge or other feature locations (often as offsets) in the mark patterns at 1104 based on the images or signals. Alignment adjustments or "offsets" are determined based on one or more of the offsets associated with individual mark patterns or sets. A final determination of 'alignment offset' for each group of marks is then based on, for example, a weighted sum of offsets associated with some or all measured mark patterns. Alternatively, individual signals can be combined, and the combined signal processed for the determination of the offset. At 1106, an exposure model associated with an exposure tool is adjusted based on one or more offsets to determine a preferred exposure pattern to achieve a selected pattern overlay. At 1108, the preferred exposure pattern is used so that one or more reticle patterns are accurately placed on a sensitized substrate. In this method, alignment can be based on one or more spatial frequency portions defined in the mark patterns and sets, which in turn correspond to spatial frequencies in a device pattern. In one example, the alignment patterns described above are used in so-called Field Image Alignment (FIA) in which alignment patterns on a wafer are imaged in a bright field image using broadband illumination.

Figure 12:
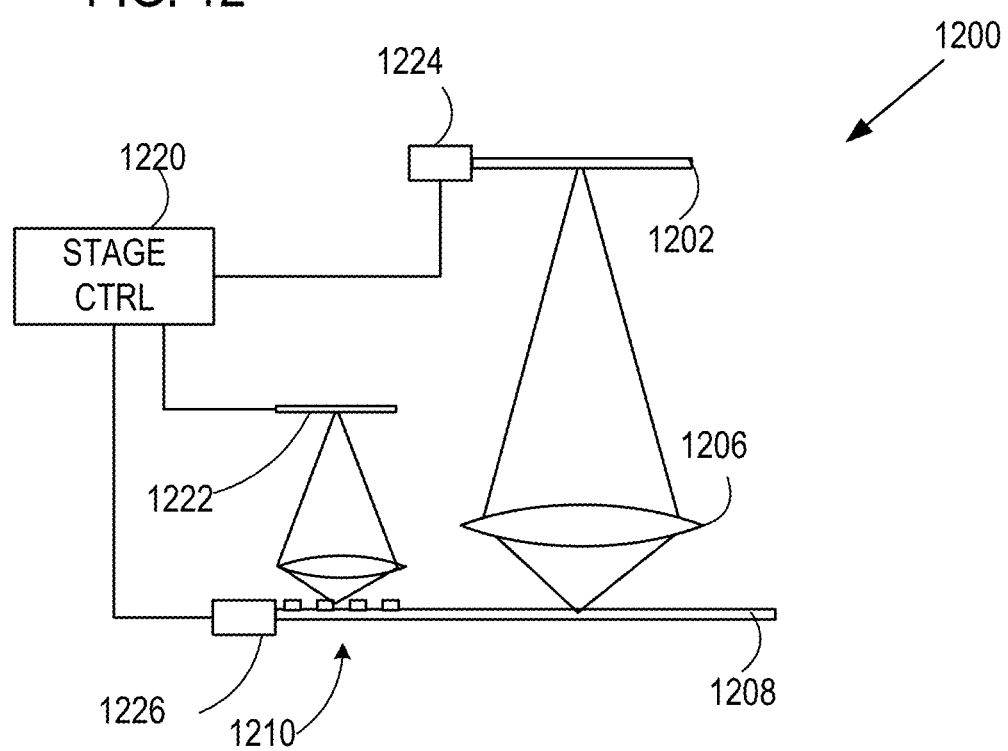
FIG. 12 illustrates a generalized alignment apparatus.

FIG. 12 is a schematic diagram illustrating an alignment apparatus 1200. A reticle 1202 is imaged onto a substrate 1208 with a lens 1206. The substrate 1208 includes a patterned region 1210 based on patterns as described above that is imaged onto an image capture device 1222. A stage controller 1220 is coupled to the image capture device 1222 and a reticle stage 1224 and a substrate stage 1226 so that substrate 1208 and the reticle 1202 can be aligned for pattern transfer.

Figure 13:
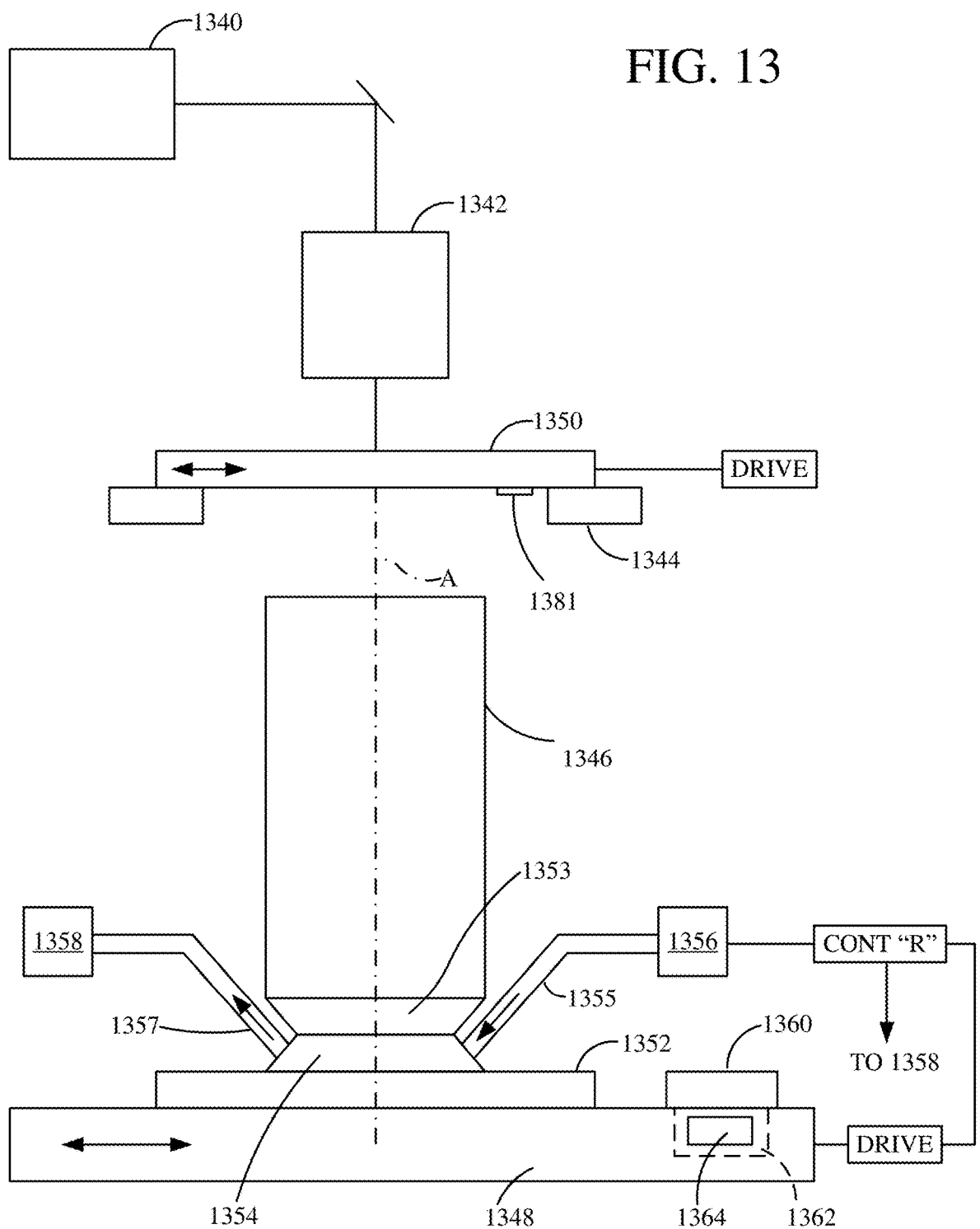
FIG. 13 is a schematic diagram of an immersion microlithography system, which is a first example of a precision system including a stage assembly as described herein.

The methods and apparatus disclosed above can be used in conjunction with various precision systems such as various types of lithography systems and other wafer processing systems and methods. Turning to FIG. 13, certain features of an immersion lithography system (an exemplary precision system) are shown, namely, a light source 1340, an illumination-optical system 1342, a reticle stage 1344, a projection-optical system 1346, and a wafer (substrate) stage 1348, all arranged along an optical axis A. The light source 1340 is configured to produce a pulsed beam of illumination light, such as DUV light of 248 nm as produced by a KrF excimer laser, DUV light of 193 nm as produced by an ArF excimer laser, or DUV light of 157 nm as produced by an F2 excimer laser. The illumination-optical system 1342 includes an optical integrator and at least one lens that conditions and shapes the illumination beam for illumination of a specified region on a patterned reticle 1350 mounted to the reticle stage 1344. The pattern as defined on the reticle 1350 corresponds to the pattern to be transferred lithographically to a wafer 1352 that is held on the wafer stage 1348. Lithographic transfer in this system is by projection of an aerial image of the pattern from the reticle 1350 to the wafer 1352 using the projection-optical system 1346. The projection-optical system 1346 typically comprises many individual optical elements (not detailed) that project the image at a specified demagnification ratio (e.g., 1/4 or 1/5) on the wafer 1352. So as to be imprintable, the wafer surface is coated with a layer of a suitable exposure-sensitive material termed a "resist."

The reticle stage 1344 is configured to move the reticle 1350 in the X-direction, Y-direction, and rotationally about the Z-axis. To such end, the reticle stage is equipped with one or more linear motors having cooled coils as described herein. The two-dimensional position and orientation of the reticle 1350 on the reticle stage 1344 are detected by a laser interferometer (not shown) in real time, and positioning of the reticle 1350 is effected by a main control unit on the basis of the detection thus made.

The wafer 1352 is held by a wafer holder ("chuck," not shown) on the wafer stage 1348. The wafer stage 1348 includes a mechanism (not shown) for controlling and adjusting, as required, the focusing position (along the Z-axis) and the tilting angle of the wafer 1352. The wafer stage 1348 also includes electromagnetic actuators (e.g., linear motors or a planar motor, or both) for moving the wafer in the X-Y plane substantially parallel to the image-formation surface of the projection-optical system 1346. These actuators desirably comprise one or more linear motors, planar motors, or both.

The wafer stage 1348 also includes mechanisms for adjusting the tilting angle of the wafer 1352 by an auto-focusing and auto-leveling method. Thus, the wafer stage serves to align the wafer surface with the image surface of the projection-optical system. The two-dimensional position and orientation of the wafer are monitored in real time by another laser interferometer (not shown). Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner.

The projection-optical system 1346 normally comprises many lens elements that work cooperatively to form the exposure image on the resist-coated surface of the wafer 1352. For convenience, the most distal optical element (i.e., closest to the wafer surface) is an objective lens 1353. Since the depicted system is an immersion lithography system, it includes an immersion liquid 1354 situated between the objective lens 1353 and the surface of the wafer 1352. As discussed above, the immersion liquid 1354 is of a specified type. The immersion liquid is present at least while the pattern image of the reticle is being exposed onto the wafer.

The immersion liquid 1354 is provided from a liquid-supply unit 1356 that may comprise a tank, a pump, and a temperature regulator (not individually shown). The liquid 1354 is gently discharged by a nozzle mechanism 1355 into the gap between the objective lens 1353 and the wafer surface. A liquid-recovery system 1358 includes a recovery nozzle 1357 that removes liquid from the gap as the supply 1356 provides fresh liquid 1354. As a result, a substantially constant volume of continuously replaced immersion liquid 1354 is provided between the objective lens 1353 and the wafer surface. The temperature of the liquid is regulated to be approximately the same as the temperature inside the chamber in which the lithography system itself is disposed.

Also shown is a sensor window 1360 extending across a recess 1362, defined in the wafer stage 1348, in which a sensor 1364 is located. Thus, the window 1360 sequesters the sensor 1364 in the recess 1362. Movement of the wafer stage 1348 so as to place the window 1360 beneath the objective lens 1353, with continuous replacement of the immersion fluid 1354, allows a beam passing through the projection-optical system 1346 to transmit through the immersion fluid and the window 1360 to the sensor 1364. Reticle/wafer alignment can be provided as illustrated above, based on alignments marks having suitable spatial frequencies in one or more directions. As shown in FIG. 13, a spatial frequency targeted alignment pattern 1381 is situated for pattern transfer.

Figure 14:
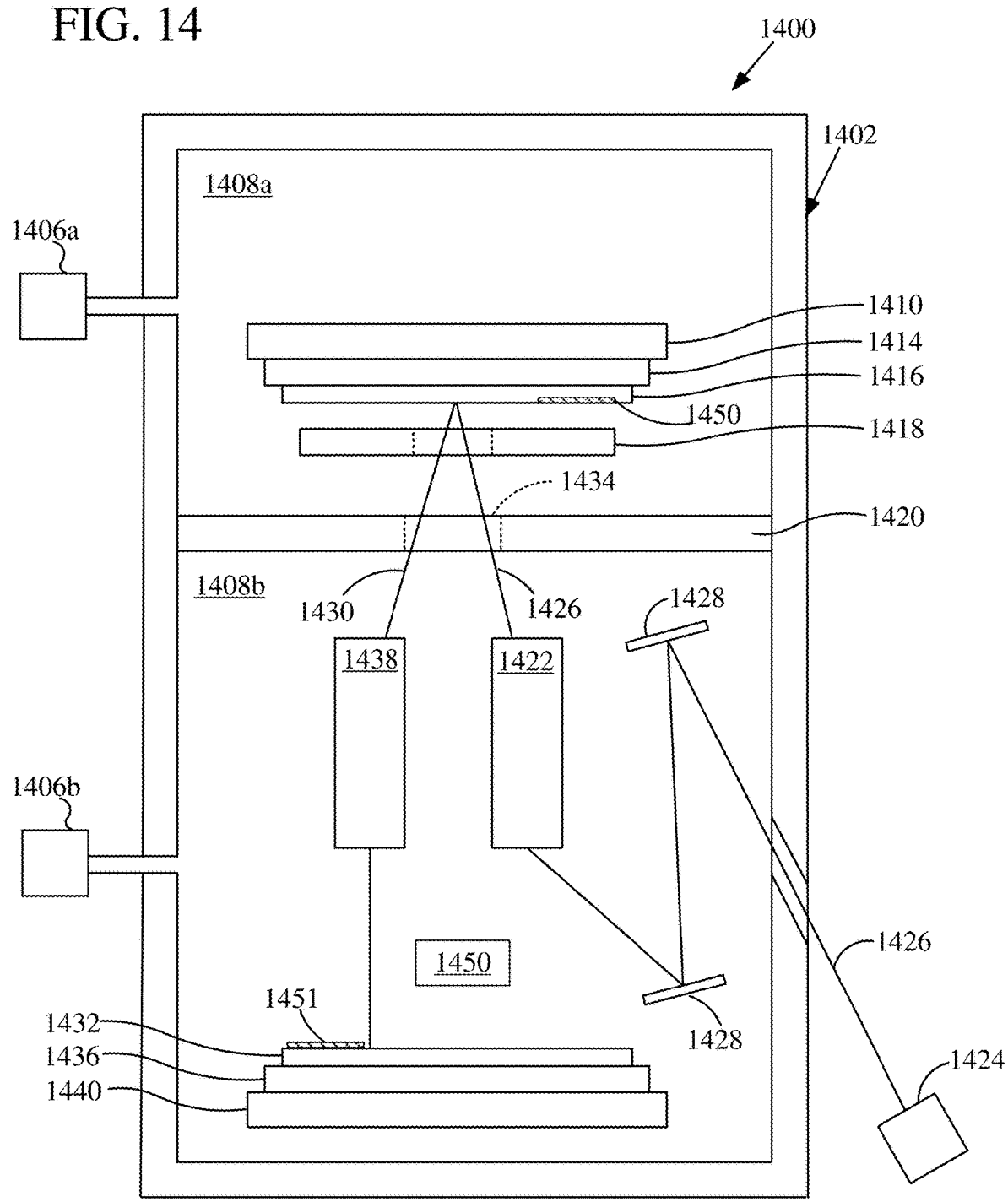
FIG. 14 is a schematic diagram of an extreme-UV microlithography system, which is a second example of a precision system including a stage assembly as described herein.

Referring now to FIG. 14, an alternative embodiment of a precision system that can include one or more electromagnetic actuators having actively cooled coils as described herein is an EUVL system 1400, as a representative precision system incorporating an electromagnetic actuator as described herein, is shown. The depicted system 1400 comprises a vacuum chamber 1402 including vacuum pumps 1406a, 1406b that are arranged to enable desired vacuum levels to be established and maintained within respective chambers 1408a, 1408b of the vacuum chamber 1402. For example, the vacuum pump 1406a maintains a vacuum level of approximately 50 mTorr in the upper chamber (reticle chamber) 1408a, and the vacuum pump 1406b maintains a vacuum level of less than approximately 1 mTorr in the lower chamber (optical chamber) 1408b. The two chambers 1408a, 1408b are separated from each other by a barrier wall 1420. Various components of the EUVL system 1400 are not shown, for ease of discussion, although it will be appreciated that the EUVL system 1400 can include components such as a reaction frame, a vibration-isolation mechanism, various actuators, and various controllers.

An EUV reticle 1416 is held by a reticle chuck 1414 coupled to a reticle stage 1410. The reticle stage 1410 holds the reticle 1416 and allows the reticle to be moved laterally in a scanning manner, for example, during use of the reticle for making lithographic exposures. Between the reticle 1416 and the barrier wall 1420 is a blind apparatus. An illumination source 1424 produces an EUV illumination beam 1426 that enters the optical chamber 1408b and reflects from one or more mirrors 1428 and through an illumination-optical system 1422 to illuminate a desired location on the reticle 1416. As the illumination beam 1426 reflects from the reticle 1416, the beam is "patterned" by the pattern portion actually being illuminated on the reticle. The barrier wall 1420 serves as a differential-pressure barrier and can serve as a reticle shield that protects the reticle 1416 from particulate contamination during use. The barrier wall 1420 defines an aperture 1434 through which the illumination beam 1426 may illuminate the desired region of the reticle 1416. The incident illumination beam 1426 on the reticle 1416 becomes patterned by interaction with pattern-defining elements on the reticle, and the resulting patterned beam 1430 propagates generally downward through a projection-optical system 1438 onto the surface of a wafer 1432 held by a wafer chuck 1436 on a wafer stage 1440 that performs scanning motions of the wafer during exposure. Hence, images of the reticle pattern are projected onto the wafer 1432.

The wafer stage 1440 can include (not detailed) a positioning stage that may be driven by a planar motor or one or more linear motors, for example, and a wafer table that is magnetically coupled to the positioning stage using an EI-core actuator, for example. The wafer chuck 1436 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 1432 to be positioned at a desired position and orientation relative to the projection-optical system 1438 and the reticle 1416.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 1422 and projection-optical system 1438) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

As shown in FIG. 14, an alignment pattern 1450 having a pattern dependent spatial frequencies is situated on the reticle 1416 for transfer, and a previously transferred alignment pattern 1451 is situated on the wafer 1432 for use in alignment.

Figure 15:
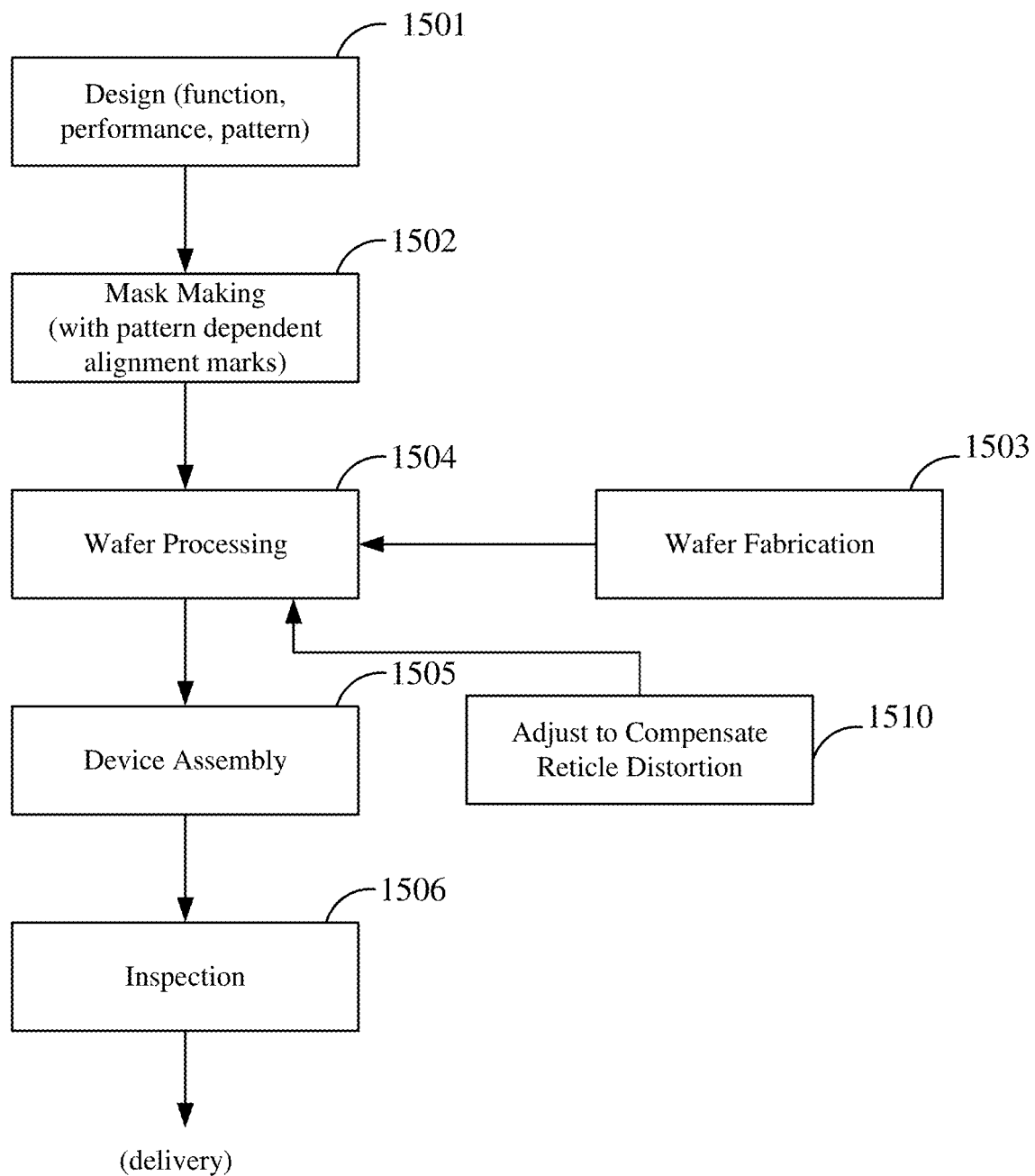
FIG. 15 is a process-flow diagram depicting exemplary steps associated with a process for fabricating semiconductor devices.

Semiconductor devices can be fabricated by processes including microlithography steps performed using microlithography systems as described above. Referring to FIG. 15, in step 1501 the function and performance characteristics of the semiconductor device are designed. In step 1502 a reticle ("mask") defining the desired pattern is designed and fabricated according to the previous design step. As discussed above, the mask includes pattern-dependent alignment marks or mark sets. Meanwhile, in step 1503, a substrate (wafer) is fabricated and coated with a suitable resist. In step 1504 ("wafer processing") the reticle pattern designed in step 1502 is exposed onto the surface of the substrate using the microlithography system. In a step 1510, reticle distortion can be estimated during exposure as described above. In step 1505 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 1506 the assembled devices are tested and inspected.

Figure 16:
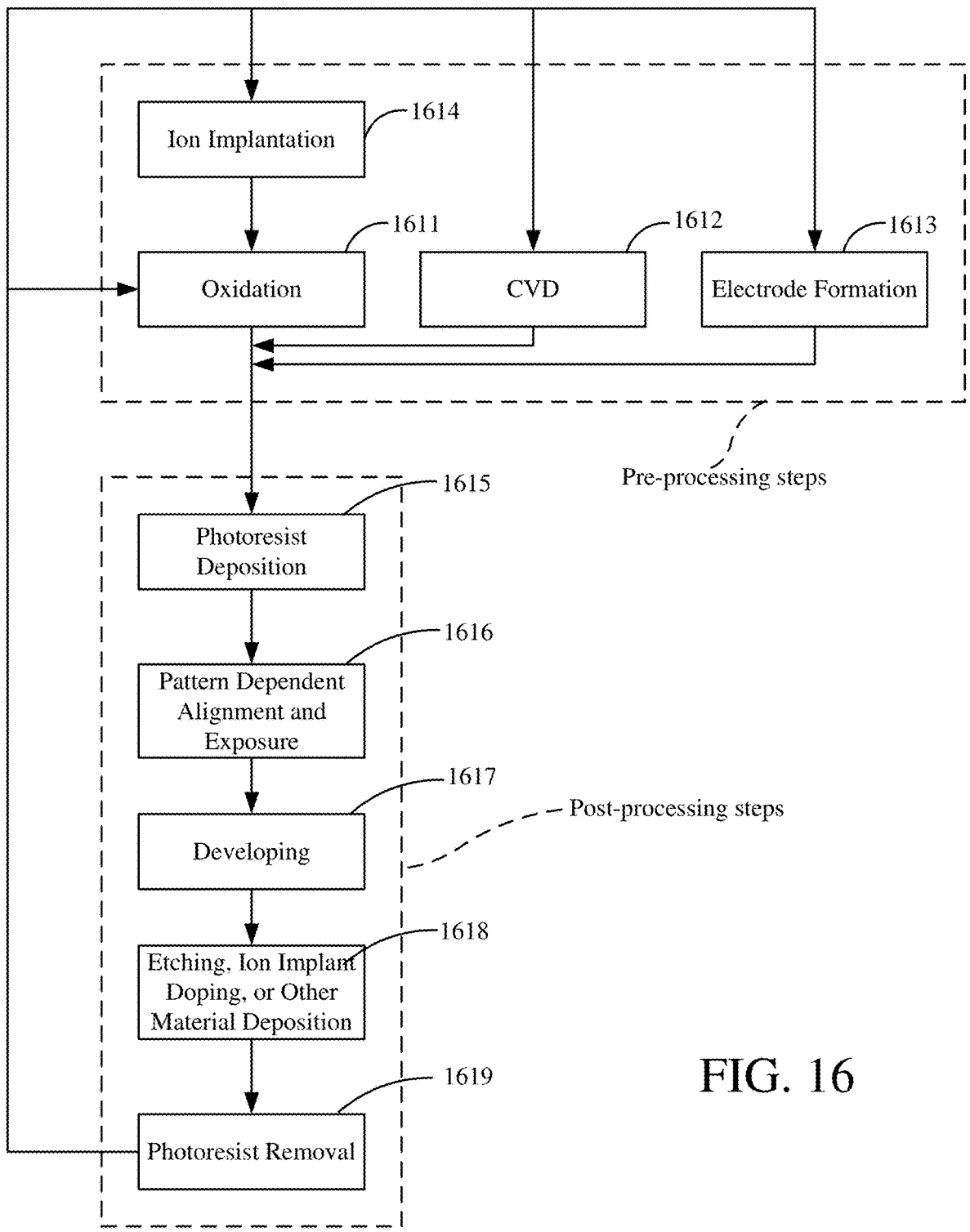
FIG. 16 is a process-flow diagram depicting exemplary steps associated with a processing a substrate (e.g., a wafer), as would be performed, for example, in the process shown in FIG. 15.

Representative details of a wafer-processing process including a microlithography step are shown in FIG. 16. In step 1611 ("oxidation") the wafer surface is oxidized. In step 1612 ("CVD") an insulative layer is formed on the wafer surface by chemical-vapor deposition. In step 1613 (electrode formation) electrodes are formed on the wafer surface by vapor deposition, for example. In step 1614 ("ion implantation") ions are implanted in the wafer surface. These steps 1611-1614 constitute representative "pre-processing" steps for wafers, and selections are made at each step according to processing requirements.

At each stage of wafer processing, when the pre-processing steps have been completed, the following "post-processing" steps are implemented. A first post-process step is step 1615 ("photoresist deposition") in which a suitable resist is applied to the surface of the wafer. Next, in step 1616 ("exposure"), the microlithography system described above is used for lithographically transferring a pattern from the reticle to the resist layer on the wafer using pattern dependent alignment patterns. In step 1617 ("developing") the exposed resist on the wafer is developed to form a usable mask pattern, corresponding to the resist pattern, in the resist on the wafer. In step 1618 ("etching, ion implant/doping, or other deposition processes"), regions not covered by developed resist (i.e., exposed material surfaces) are etched away to a controlled depth. In step 1619 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Figure 17:
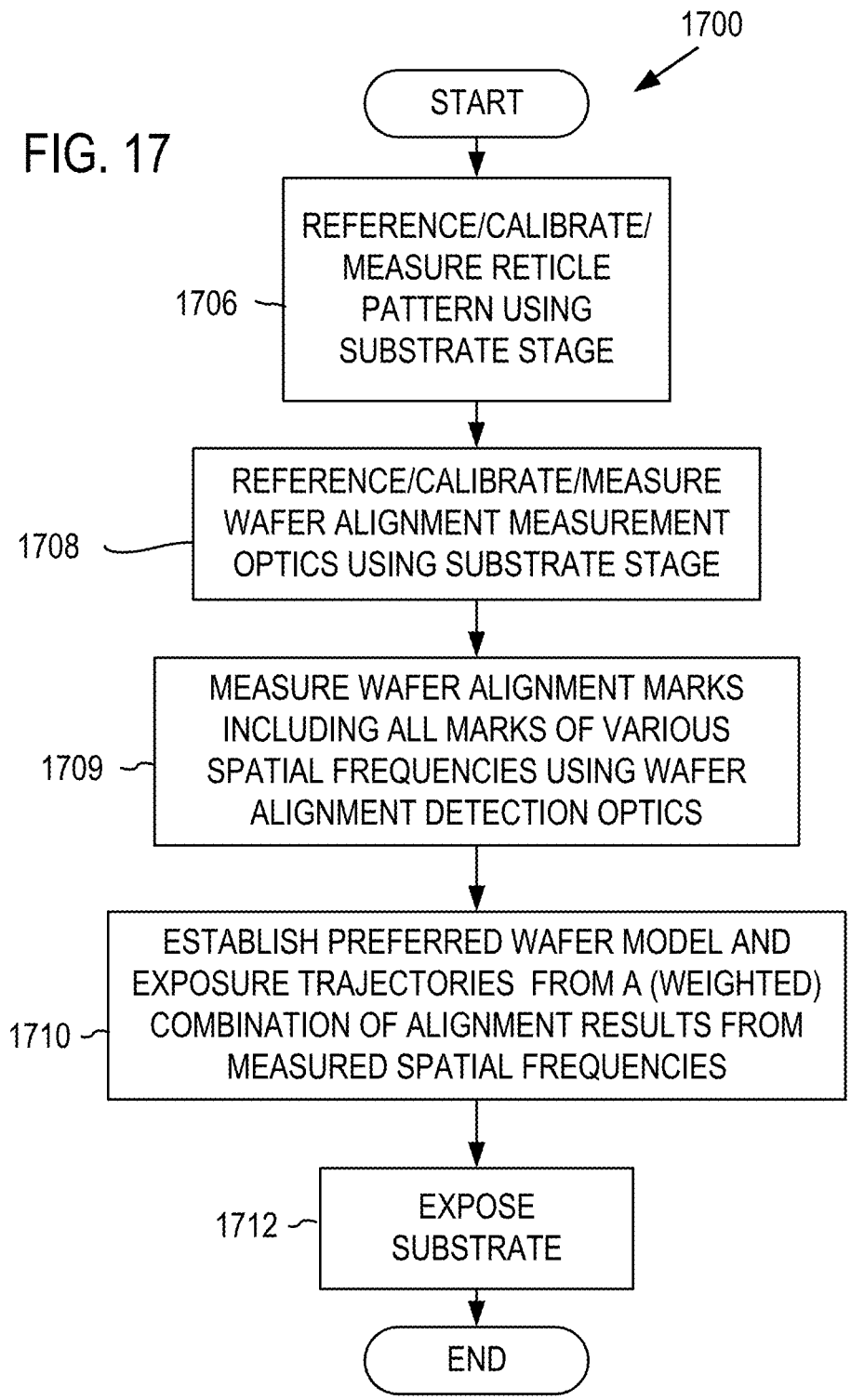
FIG. 17 illustrates an exposure method using alignment based on multiple mask patterns and selected pattern spatial frequencies.

Referring to FIG. 17, an exposure method 1700 that can be used in alignment of some or all levels in the production of an integrated circuit includes an exposure sequence having steps 1706, 1708, 1709, 1710, 1712. At 1706, a pattern on a reticle to be printed is measured according to a substrate-level image plane measurement. This measurement can be referred to as "alignment," "referencing," or "calibration" of the pattern on the reticle to be printed. This can be done via a 'through the lens' measurement of reticle patterns that are projected to the substrate plane, or through metrology by a reticle-level measurement system which has itself been separately calibrated to the image-plane metrology system. In one example, the substrate stage is used. One type of pattern or combinations of different types of patterns can be used. At 1708, wafer alignment measurement optics are calibrated using the substrate stage. At 1709, a plurality of alignment marks that are distributed over a substrate (wafer) with varying spatial frequency content are measured using wafer alignment detection optics. At 1710, a preferred wafer model is selected from one (or a weighted combination) of alignment results at the measured spatial frequencies. Alignment is typically performed by selecting one or more spatial frequency ranges of interest for determining relative positions. Based on the measurement of the reticle pattern to be printed and an existing wafer pattern, an exposure stepping or trajectory map is established for the exposure of each field. The exposure trajectory is based on one or more portions of the spatial frequency distribution associated with the pattern to be projected. At 1712, the substrate is exposed based on the exposure map.

Figure 18:
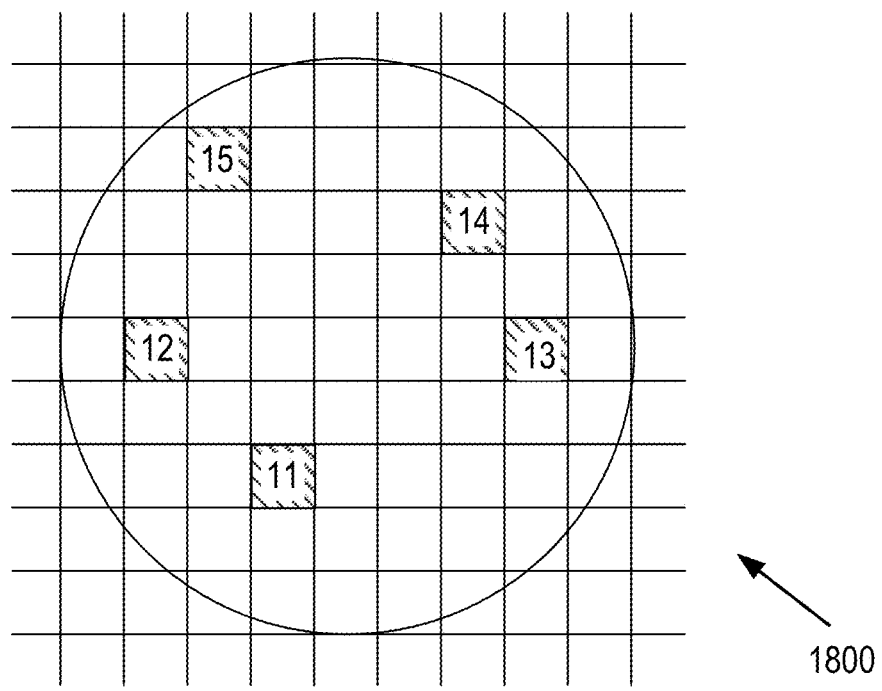
FIG. 18 illustrates exposure fields, including exposure field in which the same or different alignment marks are provided.

Alignment mark position measurements using a single type of alignment mark design can be limited by design-specific sensitivities and responses. Improved performance can be obtained using multiple different alignment mark designs on a single process level. Referring to FIG. 18, in a wafer 1800 having a plurality of exposure fields, selected fields 11-15 are provided with the same or different alignment patterns such as described above. Each of the fields 11-15 can include one or more of the same or different alignment patterns. For example, each field can have a different spatial frequency spectrum or a different orientation.

As applied to wafer alignment, a wafer exposure grid is constructed from a weighted combination of the information from each of several separate alignment mark designs. More accurate correlation to the product device positions can be achieved from the added degrees of freedom available in combining multiple (e.g. 5-10 or more) different alignment mark designs.

In addition to improved correlation to product device placement (improved product performance and yield), it is expected that the use of multiple different alignment mark designs in parallel can make the alignment system less sensitive to a local/random variation in just one type of alignment mark design or signal. That is to say, the robustness of the alignment will also be improved, due both the increased resolution of the alignment information (using a wider range of pattern variations) as well as to the increased sampling inherent in multiplying the number of different mark designs being sampled at a given process layer.

As applied to a wafer overlay measurement process, and as executed typically by specialized and dedicated Overlay Metrology tools used in the semiconductor manufacturing industry, the concepts associated with using multiple mark designs are analogous to those described above for the wafer alignment measurement case. However, in this case all measurements are only of a relative offset between two different overlay marks in close proximity to one another (one mark produced on an underlying layer, the second mark existing only as a developed resist pattern, not yet further processed). Overlay error is measured relative to a reference mark in an underlying layer. Since each single measurement uses two different marks (one from an under-layer and one from a subsequent layer), there are multiple ways to accomplish this. For example, the multiple mark designs that are exposed on a single layer may be placed next to a common reference mark design, i.e., in this case a single mark design produced on an underlayer is used as the relative reference for all different mark designs exposed on a subsequent layer.

Alternatively, during the exposure of one layer, the multiple mark designs could each be exposed/placed next to sister mark design reference marks, wherein both designs share some specific similar (or complementary, or orthogonal) characteristic, such that a difference between the two marks provides information that informs the total device overlay being achieved, when applied in concert with the other measurements made using other mark designs. Since each different mark design will have its own sensitivities that are exhibited during exposure and subsequent processing (e.g., distortion, field curvature, focus error, other aberrations, CMP, etc.), it is only through combining the information from all of the various marks that a more accurate estimate can be made of the overlay error existing on the wafer.

There are many other steps in the IC manufacturing process where overlay error measurements may be executed (i.e. not just post-develop-inspection following exposure), and this approach can be applied across any other such potential overlay error measurement. Error estimates can be based upon weighted combinations of the information from each of the separate mark designs. More accurate correlation to product device position can be obtained using the added degrees of freedom available in combining the multiple different mark designs.

FIG. 19 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 19, an exemplary system for implementing the disclosed technology includes a general purpose computing device in the form of an exemplary conventional PC 19, including one or more processing units 1902, a system memory 1904, and a system bus 1906 that couples various system components including the system memory 1904 to the one or more processing units 1902. The system bus 1906 may be any of several types of bus structures including a memory bus or memory controller, a peripheral bus, and a local bus using any of a variety of bus architectures. The exemplary system memory 1904 includes read only memory (ROM) 1908 and random access memory (RAM) 1910. A basic input/output system (BIOS) 1912, containing the basic routines that help with the transfer of information between elements within the PC 1900, is stored in ROM 1908. Computer-executable instructions for obtaining circuit pattern spatial frequency spectra are stored at 1990 along with computer-executable instructions for producing marks patterns have suitable spatial frequencies.

The exemplary PC 1900 further includes one or more storage devices 1930 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1506 by a hard disk drive interface, a magnetic disk drive interface, and an optical drive interface, respectively. The drives and their associated computer readable media provide nonvolatile storage of computer-readable instructions, data structures, program modules, and other data for the PC 1900. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1930 including an operating system, one or more application programs, other program modules, and program data. A user may enter commands and information into the PC 1900 through one or more input devices 1940 such as a keyboard and a pointing device such as a mouse. Other input devices may include a digital camera, microphone, joystick, game pad, satellite dish, scanner, or the like. These and other input devices are often connected to the one or more processing units 1902 through a serial port interface that is coupled to the system bus 1906, but may be connected by other interfaces such as a parallel port, game port, or universal serial bus (USB). A monitor 1946 or other type of display device is also connected to the system bus 1906 via an interface, such as a video adapter. Other peripheral output devices, such as speakers and printers (not shown), may be included.

The PC 1900 may operate in a networked environment using logical connections to one or more remote computers, such as a remote computer 1960. In some examples, one or more network or communication connections 1950 are included. The remote computer 1960 may be another PC, a server, a router, a network PC, or a peer device or other common network node, and typically includes many or all of the elements described above relative to the PC 1900, although only a memory storage device 1962 has been illustrated in FIG. 19. The personal computer 1900 and/or the remote computer 1960 can be connected to a logical a local area network (LAN) and a wide area network (WAN). Such networking environments are commonplace in offices, enterprise wide computer networks, intranets, and the Internet.

When used in a LAN networking environment, the PC 1900 is connected to the LAN through a network interface. When used in a WAN networking environment, the PC 1900 typically includes a modem or other means for establishing communications over the WAN, such as the Internet. In a networked environment, program modules depicted relative to the personal computer 1900, or portions thereof, may be stored in the remote memory storage device or other locations on the LAN or WAN. The network connections shown are exemplary, and other means of establishing a communications link between the computers may be used.

In view of the many possible embodiments to which the principles of the disclosure may be applied, it should be recognized that the illustrated embodiments are only preferred examples and should not be taken as limiting. We claim all that comes within the scope and spirit of the appended claims.

We claim:

1. A pattern mask, comprising:
   a substrate;
   a plurality of device pattern areas defined on the substrate; and
   a set of alignment marks defined on the substrate and distributed along a first direction, wherein each alignment mark includes a periodic array of alignment mark elements along the first direction.

2. The pattern mask of claim 1, wherein at least one of the alignment marks includes a plurality of segments distributed along a second axis that is different from the first axis.

3. The pattern mask of claim 2, wherein the second axis is perpendicular to the first axis.

4. The pattern mask of claim 1, wherein each of the alignment marks is associated with a different spatial frequency.

5. The pattern mask of claim 1, wherein at least two of the alignment marks are associated with a common spatial frequency.

6. The pattern mask of claim 1, wherein the alignment mark elements are lines and spaces.

7. The pattern mask of claim 6, wherein the lines and spaces are periodically situated along the first axis, and the lines and spaces have a common width along the first axis.

8. The pattern mask of claim 7, wherein the lines and spaces are periodically situated along the first axis, and a line width is different from a space width.

9. The pattern mask of claim 1, wherein the alignment mark elements are dots, polygons, T-shapes, or cross-shapes.

10. The pattern mask of claim 1, wherein each of the periodic arrays of alignment mark elements is associated with a different spatial frequency.

11. The pattern mask of claim 1, further comprising a plurality of sets of alignment marks defined on the substrate, each alignment mark set extending along the first direction, wherein each alignment mark includes a periodic array of alignment mark elements along the first direction.

12. The pattern mask of claim 11, wherein at least one of the alignment marks of each set includes a plurality of segments distributed along a second axis that is different from the first axis.

13. The pattern mask of claim 11, wherein each of the sets of alignment marks is associated with a different spatial frequency.

14. The pattern mask of claim 6, wherein the alignment mark elements are lines and spaces that are periodically situated along the first axis, and the lines and spaces have a common width along the first axis.

15. The pattern mask of claim 11, wherein the alignment mark elements are dots, polygons, T-shapes, or cross-shapes.

16. A method, comprising:
   with the pattern mask of claim 1, defining a plurality of sets of alignment marks on a circuit substrate, each alignment mark set distributed along the first direction, wherein each alignment mark includes a periodic array of alignment mark elements along the first direction;
   defining at least a first circuit pattern on the circuit substrate;
   aligning a second circuit pattern with respect to the first circuit pattern based on detection of at least one of the plurality of sets of alignment marks.

17. The method of claim 16, wherein the detection of at least one of the plurality of sets of alignment marks includes illuminating the at least one of the plurality of sets of alignment marks and obtaining an image of the at least one of the plurality of sets of alignment marks.

18. The method of claim 17, wherein the alignment of the second circuit pattern is based on a spatial frequency defined by the at least one of the plurality of sets of alignment marks.

19. The method of claim 16, further comprising defining the second circuit pattern on the circuit substrate after aligning the second circuit pattern.

20. A method, comprising:
   obtaining a spatial frequency spectrum associated with a circuit pattern;
   based on the obtained spatial frequency spectrum, defining alignment mark set patterns that include a plurality of alignment marks distributed along a first direction, wherein each alignment mark includes a periodic array of alignment mark elements along the first direction; and
   transferring the alignment mark set patterns to a mask.

21. The method of claim 20, wherein the transferring comprises establishing the alignment mark set patterns in a metallic layer on a mask substrate.

22. The method of claim 20, wherein the transferring comprises establishing the alignment mark set patterns at a plurality of locations in a metallic layer on a mask substrate.

23. A method, comprising:
determining a spatial frequency spectrum associated with a pattern to be transferred from a reticle to a sensitized substrate; and
defining a periodic reticle pattern based on the spatial frequency spectrum.

24. The method of claim 23, further comprising forming the pattern to be transferred and the periodic reticle pattern on a reticle.

25. The method of claim 24, further comprising exposing a sensitized substrate to the pattern to be transferred and the periodic reticle pattern on a reticle.

26. A pattern mask comprising:
a substrate;
first device patterns with a first pitch arranged on the substrate;
second device patterns with a second pitch different from the first pitch, arranged on the substrate; and
an alignment mark including first segments arranged with the first pitch and second segments arranged with the second pitch.

27. The pattern mask of claim 26, wherein the alignment mark includes a plurality of lines, each of lines including first segments arranged with the first pitch and second segments arranged with the second pitch.

28. A pattern mask comprising:
a substrate;
first device patterns arranged on the substrate, the first device patterns having a first pitch;
second device patterns arranged on the substrate, the second device patterns having a second pitch different from the first pitch; and
an alignment mark including a plurality of segments associated with a power spectral density corresponding to a weighted combination of the first pitch and the second pitch, wherein the plurality of segments includes first segments arranged with the first pitch and second segments arranged with the second pitch.

29. The pattern mask of claim 28, wherein the alignment mark includes a plurality of lines, and wherein each of lines includes a plurality of segments.

30. An exposure method comprising:
preparing the pattern mask of claim 26;
irradiating the pattern mask with an exposure beam to form a patterned exposure beam; and
exposing a workpiece with the patterned exposure beam.

31. The exposure method of claim 30, further comprising:
detecting an alignment mark on the workpiece that is formed by the exposure of the workpiece with the patterned exposure beam;
positioning the substrate by based on the detection of the alignment mark; and
exposing the positioned workpiece.

32. An exposure method comprising:
preparing the pattern mask of claim 28;
irradiating the pattern mask with an exposure beam to produce a patterned exposure beam; and
exposing a workpiece with the patterned exposure beam.

33. The exposure method of claim 32, further comprising:
detecting an alignment mark on the substrate, wherein the alignment mark is formed by the exposure of the workpiece to the patterned exposure beam;
positioning the substrate by based on the detection of the alignment mark; and
exposing the positioned workpiece.

34. A pattern mask comprising:
a substrate;
first device patterns arranged on the substrate, the first device patterns having a first pitch;
second device patterns arranged on the substrate, the second device patterns having a second pitch different from the first pitch; and
an alignment mark including a plurality of segments having a spatial frequency distribution that is a combination of the first pitch and the second pitch.

35. The pattern mask of claim 34, wherein the spatial frequency distribution of the alignment marks is based on a weighted average of the first pitch and the second pitch.

36. The pattern mask of claim 34, wherein the weighted average of the first pitch and the second pitch corresponds to the power spectral density associated with a combination of the first device patterns and the second device patterns.

37. A method, comprising:
illuminating a set of marks on a workpiece, wherein the set of marks is transferred to the workpiece from the pattern mask of claim 1; and
detecting the set of marks on the workpiece.

38. A method comprising:
illuminating a set of marks on a workpiece; and
detecting the set of marks, wherein the set of marks is distributed along a first direction, and each mark includes a periodic array of mark elements along the first direction.

39. The method of claim 38, at least one of the marks includes a plurality of segments distributed along a second direction which is different from the first direction.

40. The method of claim 38, wherein each of the marks is associated with a different spatial frequency.

* * * * *